United States Patent [19]

Watkins

[11] 4,323,798

[45] Apr. 6, 1982

[54] FAST OPERATING SWITCHABLE OPERATIONAL AMPLIFIER DRIVEN CIRCUITS

[75] Inventor: Grant H. Watkins, Upper Marlboro, Md.

[73] Assignee: The United States of America as represented by the Secretary of the Air Force, Washington, D.C.

[21] Appl. No.: 141,501

[22] Filed: Apr. 18, 1980

[51] Int. Cl.³ .......................... H03B 1/03; H03F 1/36
[52] U.S. Cl. .................................. 307/491; 328/167; 307/353; 330/107
[58] Field of Search .................. 307/493, 491, 353; 328/167; 330/107, 109, 291

[56] References Cited

U.S. PATENT DOCUMENTS 3,516,002  6/1970  Hillis .................................. 307/253
3,696,305 10/1972  Mitchell ............................. 307/253
3,781,697 12/1973  Bruinshorst et al. ............... 328/167
3,919,658 11/1975  Friend ................................. 330/107
4,210,873  7/1980  Suzuki et al. ...................... 330/107
4,220,875  9/1980  Lawton .............................. 307/493

Primary Examiner—Harold A. Dixon
Attorney, Agent, or Firm—Donald J. Singer; Willard R. Mathews, Jr.

[57] ABSTRACT

Faster switching speeds for switchable noise filters and faster sampling speeds for sample and hold circuits are realized by means of an operational amplifier driven circuit in which excess feedback loop gain of the operational amplifier is used to reduce the effective value of resistance in the device's capacitor charging circuit. Two operational feedback loops are used, one or the other of which is switched into the circuit to effect either an open loop or a closed loop condition. The time required to charge the device's capacitor is a function of the ratio of the operational amplifier's closed loop gain divided by its open loop gain.

8 Claims, 9 Drawing Figures

FAST OPERATING SWITCHABLE OPERATIONAL AMPLIFIER DRIVEN CIRCUITS

STATEMENT OF GOVERNMENT INTEREST

The invention described herein may be manufactured and used by or for the Government for governmental purposes without the payment of any royalty thereon.

BACKGROUND OF THE INVENTION

This invention relates to electronic circuits such as noise filters and sample and hold circuits that are switched into and out of radars, analog/digital converters and other electronic systems. In particlar, the invention relates to fast operating switchable operational amplifier driven circuits of that type.

In many radar and ECCM applications, it is required to either quickly sample and hold for a long period of time a high frequency analog signal, or to quickly switch into the path of a high frequency analog signal a low pass filter with a very long time constant. Such requirements are particularly found in the design of high speed A/D converters, where sample and hold circuits are used, and in the design of low noise STA-LO's, where switchable low pass filters are used.

Switchable noise filters generally comprise a driving operational amplifier the output of which is connected to its output through a resistor. A capacitor is connected between the output and ground. Switching to determine low frequency break is accomplished by a field effect transistor switch that parallels the resistor. The sample and hold circuit is similar except that the resistor is eliminated and the field effect transistor switch is inserted in and switches the operational amplifier output line directly. In both circuits for a given capacitor value the switching time is limited and determined by the ON resistance of the field effect transistor switch.

The present invention is directed toward improving the switching time in such circuits by employing an operational amplifier having two alternative feedback loops and utilizing the excess feedback loop gain resulting therefrom to reduce effective resistance in the capacitor charging circuit.

SUMMARY OF THE INVENTION

The invention comprises a fast operating switchable operational amplifier driven electronic circuit. In a first embodiment it provides increased switching speed over that attainable from a conventional switchable noise filter. In another embodiment it provides faster sampling speed over that attainable with conventional sample and hold design techniques.

The switchable noise filter mechanization of the invention includes an operational amplifier the output of which is fed to an output through a resistor, together with a capacitor that is connected between the output and ground. The operational amplifier has two feedback loops, one from its output to its negative input and the other from the output side of the resistor to its negative input. The feedback loops are alternately opened and closed by field effect transistor switches resulting in an excess feedback loop gain that is used to reduce the effective value of resistance in the capacitor charging circuit. A shunt diode circuit across the resistor is provided to supply large charging current to the capacitor under large signal conditions.

The circuit for the sample and hold embodiment of the invention is similar except that the resistor and shunt diode circuit are replaced by an in-line field effect transistor switch.

In each embodiment capacitance means are connected to the feedback loops to prevent simultaneous opening of the loops. The feedback loop field effect transistors are selected to have ON resistance that, in series, constitutes a small resistance value relative to the feedback circuit resistance. The feedback loop field effect transistors are also selected to have minimized gate-source and gate-drain capacitance and the capacitor is maximized.

It is a principal object of the invention to provide new and improved fast operating switchable operational amplifier driven electronic circuits.

It is another object of the invention to provide a new and improved switchable noise filter.

It is another object of the invention to provide a switchable noise filter having faster switching time than can be obtained with currently available devices.

It is another object of the invention to provide a new and improved sample and hold circuit.

It is another object of the invention to provide a sample and hold circuit having faster sampling speed than that attainable with conventional sample and hold design techniques.

It is another object of the invention to provide circuits of the type described in which switching transients are minimized.

These together with other objects, features and advantages of the invention will become more readily apparent from the following detailed description when taken in conjunction with the illustrative embodiments in the accompanying drawings wherein like elements are given like reference numerals throughout.

DETAILED DESCRIPTION OF THE PREFERRED EMBODIMENTS

The technique of the invention provides increased switching speed over that attainable from a conventional switched noise filter. It also provides faster sampling speed over that attainable with conventional sample and hold design techniques.

Figure 1:
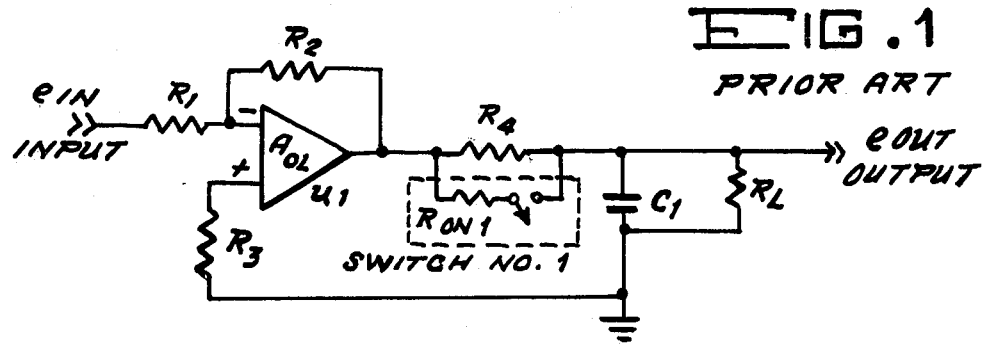
FIG. 1 is a schematic diagram of a conventional switchable noise filter.
Figure 2:
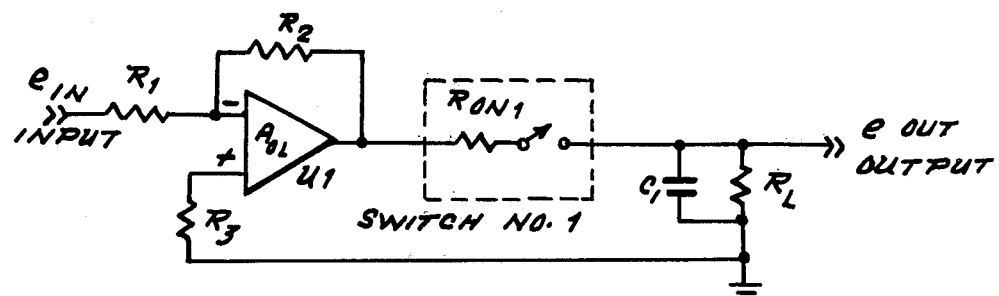
FIG. 2 is a schematic diagram of a conventional sample and hold circuit.
Figure 3:
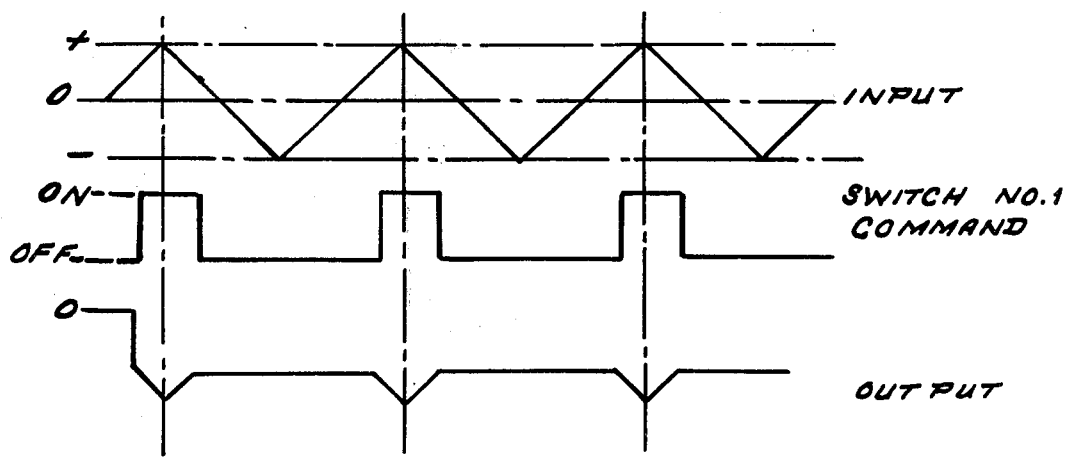
FIG. 3 illustrates the input, output, and switch command waveforms associated with the circuits of FIGS. 1 and 2.

FIG. 1 illustrates a conventional switchable low pass filter driven by an operational amplifier. It comprises operational amplifier U1 having input resistors R1, R3, and feedback resistor R2, resistor R4, resistor R4 bypass switch No. 1, capacitor C1, load resistor RL and an input and output as shown. FIG. 2 shows a conventional sample and hold circuit also driven by an operational amplifier. This circuit is similar to that of FIG. 1 except that resistor R4 is eliminated and switch No. 1 is in series with the operational amplifier and the circuit output. FIG. 3 illustrates the input, output and switch command waveforms associated with each of these circuits.

Having reference to the noise filter of FIG. 1, the low frequency break is determined, when switch No. 1 is off, by the time constant R4C1. The time required to fully charge C1 is determined by the product of the ON resistance of switch No. 1 and C1-RonC1-when the operational amplifier is not slew rate limited.

In the sample and hold circuit embodiment of the invention the time required to obtain an accurate sample of the analog input signal is again determined by the product of the on resistance of switch No. 1 and C1, RonC1.

In both circuits, for a given value of C1, the switching time is limited and determined by the ON resistance of the field effect transitor (FET) used for switch No. 1.

Figure 4:
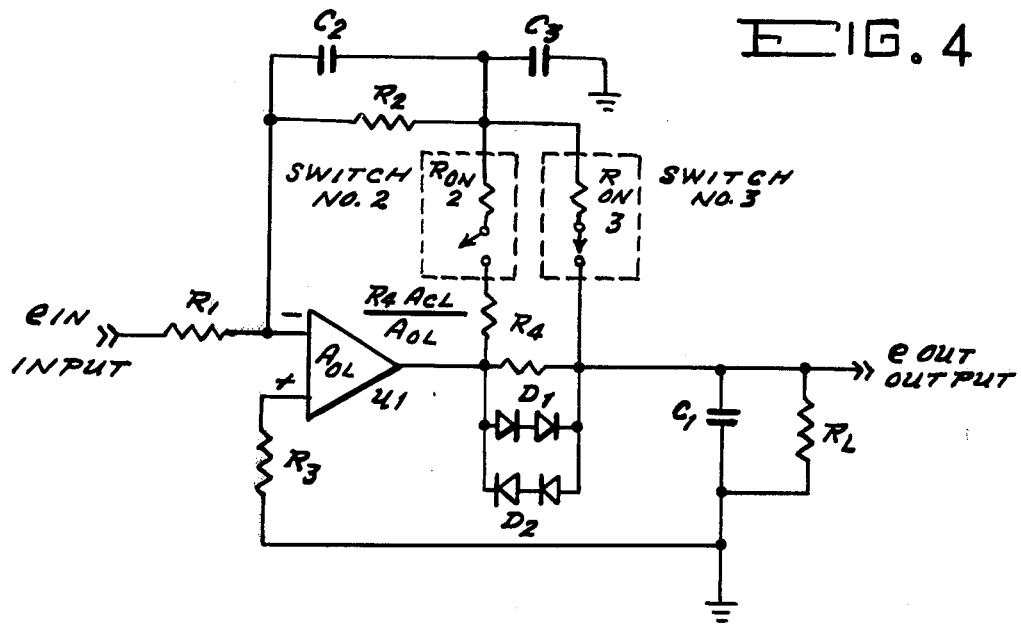
FIG. 4 is a schematic diagram of the switchable noise filter embodiment of the invention.
Figure 5:
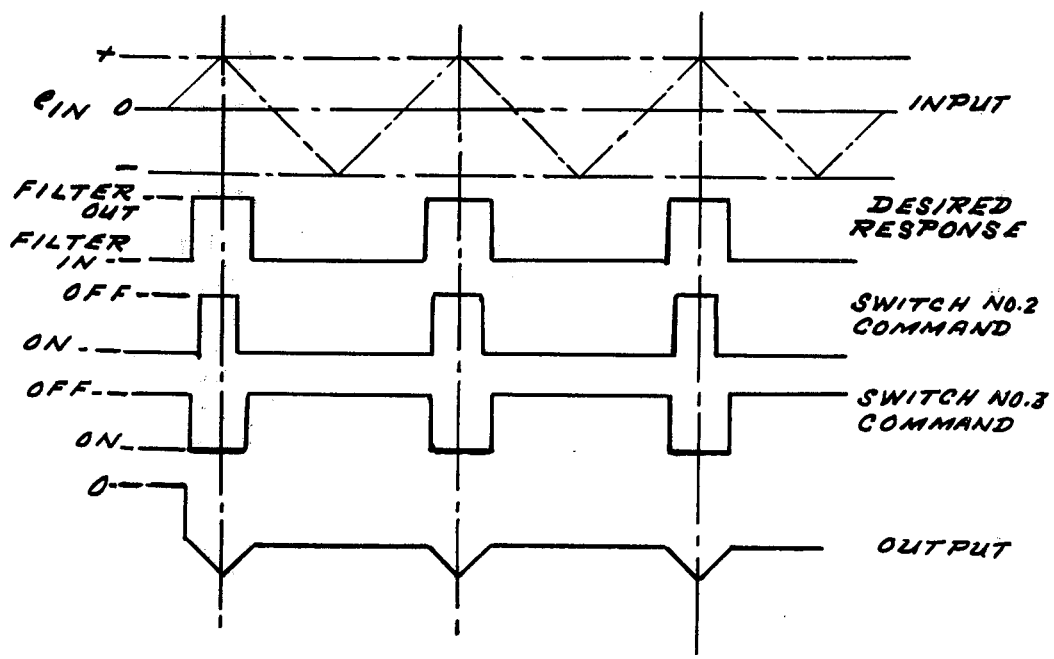
FIG. 5 illustrates the input, output, desired response and first and second switch command waveforms associated with the circuit of FIG. 4.

FIG. 4 illustrates the noise filter embodiment of the invention and shows a switchable low pass filter with corner frequency determined by R4C1. FIG. 5 illustrates the input, output, desired response, and switch command waveforms associated with the circuit of FIG. 4. In the circuit of FIG. 4 the shunt FET switch across R4 of FIG. 1 is eliminated, and replaced by FET switches switch No. 2 and switch No. 3. The filter is switched out and C1 is charged up quickly with switch No. 2 off and switch No. 3 on. The filter is switched in when switch No. 2 is on and switch No. 3 is off. The time required to charge C1 is determined by the time constant (R4cl/Aol) (C1), where Aol=Open loop gain of Op Amp, and Acl=R2/R1=closed loop gain of Op amp. The novelty of this circuit is the fact that the excess loop gain of the Op Amp-Aol/Acl- is used to reduce the effective value of R4 to the value R4Acl/Aol. The shunt diodes D1, D2 across R4 are required to supply large charging current to C1 under large signal conditions; under such conditions their dynamic impedance, Rd, is also reduced by the factor Aol/Acl.

As an example, the open loop gain of a typical LH0032 operational amplifier is 76 db=X6309. If R2/Fl=3.16, R4=82K and C1=0.22 $\mu$fd, the effective value of R4 is (8200×3.16)/6309=41.1 ohms, and the effective charging time constant is 0.904 $\mu$s for the circuit of FIG. 4.

The advantage of the switchable noise filter of FIG. 4 over that of FIG. 1 is faster filter switching: the settling time of FIG. 1 is limited by the time constant RonC1, the settling time of FIG. 4 is limited by the time constant $$Cl\left(\frac{R4Rd}{R4+Rd}\right)\frac{Acl}{Aol},$$

where Rd=diode dynamic impedance.

The series resistance $Ron_2$ and $Ron_3$ of the FET switches should be small compared to the value of $R_2$ so that the closed loop gain R2/R1 is not appreciably affected by variations in $Ron_2$ and $Ron_3$. Also, the corner frequency determined by C1 R4 Acl/Aol must be chosen so that the stability of the operational amplifier is not affected when switch No. 3 is on and switch No. 2 is off.

Figure 6:
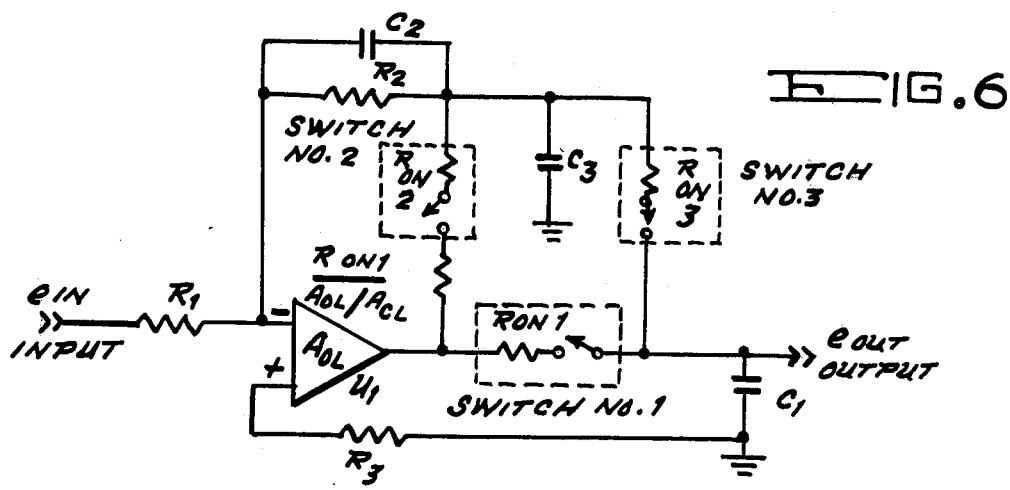
FIG. 6 is a schematic diagram of the sample and hold circuit embodiment of the invention.
Figure 7:
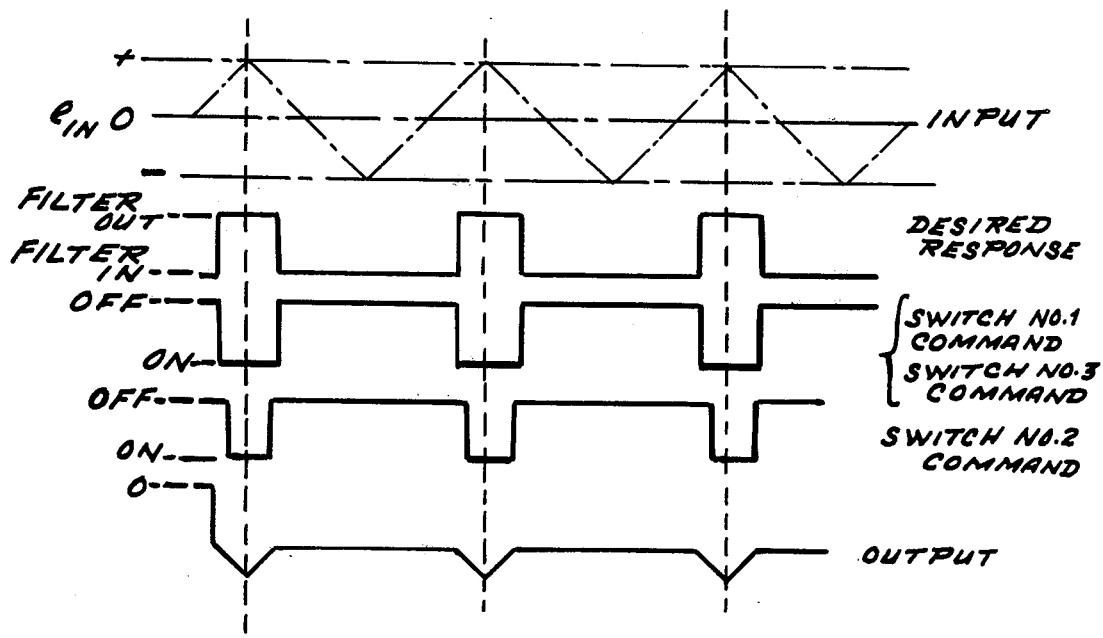
FIG. 7 illustrates the input, output, desired response and first, second and third switch command waveforms associated with the circuit of FIG. 6.

FIG. 6 shows a sample and hold circuit designed with the same novel technique of using the excess loop gain of the operational amplifier to reduce the effective sampling time constant to C1Ron (Acl/Aol). FIG. 7 illustrates the various waveforms associated with this circuit. For a given value of C1, the sampling time is no longer strictly limited by the value of Ron, but is limited by $Ron_1$ Acl/Aol; hence the sampling time is greatly reduced.

As an example, if the open loop gain of the operational amplifier is 76 db=X 6309, R2/R1=3.16, C1=0.022 $\mu$fd and $Ron_1$=50 ohms, the effective charging time constant $$=\frac{50\times 3.16}{6309}\times .022\times 10^{-6}=+0.55NS.$$

Figure 8:
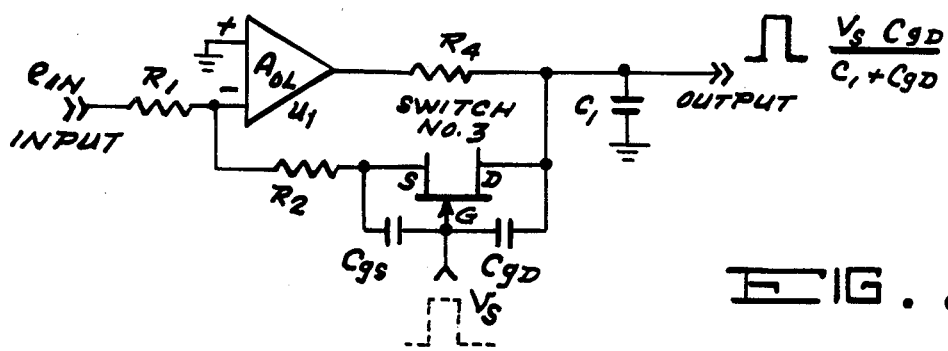
FIG. 8 is a schematic diagram of a switchable noise filter for illustrating switching transients due to intrinsic FET capacitance.

One major source of switching transients in any circuit using FET switches is caused by feed-thru of the gate switching signal -Vs- onto the source or drain via the gate-source capacitance -Cgs-, and via the gate-drain capacitance -Cgd. As shown in FIG. 8, the gate switching signal Vs appears on C1 on magnitude Vs Cgd/(C1+Cgd). Hence, to minimize these switching transients, C1 must be maximized, and Cgs and Cgd must be minimized. Because FET switch No. 2 and switch No. 3 do not carry the large currents required by C1, they can be chosen for minimum Cgs and Cds without regard for their current carrying capabilities.

Furthermore, a switching transient can be caused if the feedback loop is allowed to open momentarily. For slow driving speeds, the waveforms to switch No. 2 and switch No. 3 should overlap slightly, as shown by the switch command waveform in FIG. 5 and FIG. 7. For fast driving speeds, capacitors C2 and C3 should be sufficient for preventing the feedback loop from momentarily opening.

Figure 9:
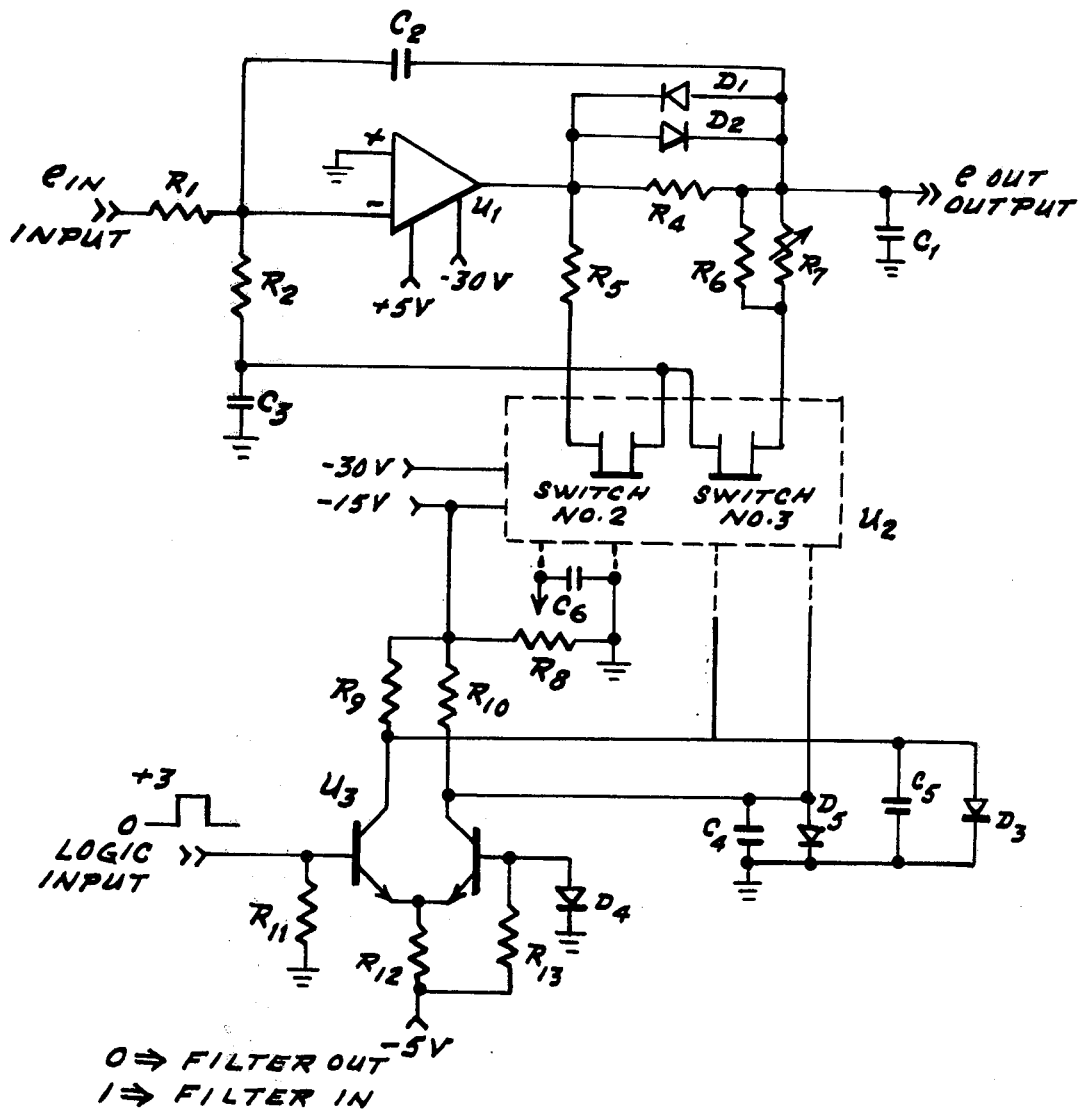
FIG. 9 is a detailed schematic diagram of the switchable noise filter embodiment of the invention.

By way of example, a detailed schematic diagram of the switchable noise filter embodiment of the invention is illustrated by FIG. 9. In the following description component values and identification are designated in parenthesis.

Referring now to FIG. 9, the noise filter comprises operational amplifier U1 (LH0032), input resistor R1(1.5K), feedback resistor R2(3.9K), resistors R4(82K), R5(10 ohms), R6(20 ohms), R7(100 ohms), diodes D1, D2 (IN4148), capacitors C1(0.022 fd), C2(370 pfd), C3(100 pfd) and FET switching unit U2(DG200AP). Also shown is the switching control circuit which comprises transistor element U3(2N3811), diodes D3, D4, D5 (IN4148), capacitors C4(510 pfd), C5(510 pfd), C6(0.1 fd), and resistors R8(20K), R9(1K), R10(1K), R11(1K) R12(330 ohm) and R13(1K). Resistors R5, R6 and R7 are used to make the closed loop gain the same with Logic '0' and Logic '1' inputs. Resistor R8 is used to adjust the threshold at which FET switches switch No. 2 and switch No. 3 switch. With R4=82K and C1=0.022 fd, the low pass filter break frequency is 100 Hz. Although a siliconix DG 200 AP was used because of its low Ggs and Cgd and its adjustable switching threshold, it is not necessarily an optimum device for this application: switching speed is around 300 ns, and switching action is "break before make." What is required for optimum performance from this circuit is switching time of several Nanoseconds, and "make before break" action.

While the invention has been described in terms of its preferred embodiment it is understood that the words which have been used are words of description rather than words of limitation and that changes within the purview of the appended claims may be made without departing from the scope and spirit of the invention in its broader aspects.

What is claimed is:

1. An electronic circuit that is switchable into and out of an electronic system comprising, input means, output means, an operational amplifier having first and second inputs and an output, said first operational amplifier input connected through a first resistor to said input means, an electrical component connected between the output of said operational amplifier and said output means, a first capacitance means connected between said output means and ground, a first feedback loop comprised of a second resistor and a first switch means connected in series between the output and the first input of said operational amplifier, and a second feedback loop comprised of said second resitor and a second switch means connected in series between the first operational amplifier input and said output means, said first switch means being closed when said electronic circuit is switched into said electronic system and open when said electronic circuit is switched out of said electronic system, and said second switch means being open when said electronic circuit is switched into said electronic system and closed when said electronic circuit is switched out of said electronic system.

2. An electronic circuit as defined in claim 1 including a second capacitance means connected to said first and second feedback loops, and wherein said first and second switch means are comprised of field effect transistors.

3. An electronic circuit as defined in claim 2 wherein said field effect transistors are selected to have on resistances that in series constitute a small resistance value relative to the resistance value of said second resistor, the relative resistance values thereof being effective to render feedback loop gain substantially immune to normal variations in the on resistances of said field effect transistors.

4. An electronic circuit as defined in claim 3 wherein said field effect transistors are selected to have minimized gate-source capacitance and minimized gate-drain capacitance and the capacitance of said first capacitor means is maximized.

5. An electronic circuit as defined in claim 4 wherein said electronic circuit is adapted to function as a switchable noise filter and said electrical component is a resistor.

6. An electronic circuit as defined in claim 5 including a diode circuit connected in parallel with said electrical component.

7. An electronic circuit as defined in claim 4 wherein said electronic circuit is adapted to function as a sample and hold circuit and said electrical component comprises a switch means.

8. An electronic circuit as defined in claim 7 wherein said switch means comprises a field effect transistor.

* * * * *